(12) United States Patent
Takahashi et al.

(10) Patent No.: US 9,204,572 B2
(45) Date of Patent: Dec. 1, 2015

(54) HEAT RADIATION ARRANGEMENT

(75) Inventors: Hisao Takahashi, Toyota (JP); Satoru Anada, Kawagoe (JP); Toru Iwazumi, Kawagoe (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 178 days.

(21) Appl. No.: 14/009,438

(22) PCT Filed: Jul. 7, 2011

(86) PCT No.: PCT/JP2011/065576
§ 371 (c)(1),
(2), (4) Date: Oct. 2, 2013

(87) PCT Pub. No.: WO2012/164756
PCT Pub. Date: Dec. 6, 2012

(65) Prior Publication Data
US 2014/0083994 A1    Mar. 27, 2014

(30) Foreign Application Priority Data
Jun. 1, 2011    (JP) .................................. 2011-123475

(51) Int. Cl.
*H05K 7/20* (2006.01)
*H01L 23/34* (2006.01)
*H05B 3/22* (2006.01)
*H01L 23/40* (2006.01)
(Continued)

(52) U.S. Cl.
CPC .............. *H05K 7/20* (2013.01); *H01L 23/4006* (2013.01); *H05B 3/22* (2013.01); *H05K 7/20454* (2013.01); *H01L 23/3737* (2013.01); *H01L 23/42* (2013.01); *H01L 2023/4062* (2013.01); *H01L 2924/0002* (2013.01)

(58) Field of Classification Search
CPC ...... H05K 7/20; H05K 7/20454; H01L 23/42; H01L 23/4006
USPC ........... 257/706, 707; 438/122; 361/704, 707, 361/709, 713, 714, 717; 219/530
See application file for complete search history.

(56) References Cited

U.S. PATENT DOCUMENTS 5,959,840 A * 9/1999 Collins et al. ................. 361/713
6,317,325 B1 11/2001 Patel et al.
6,351,387 B1 * 2/2002 Prasher ......................... 361/707
(Continued)

FOREIGN PATENT DOCUMENTS

JP  A-2002-050889  2/2002
JP  A-2006-156465  6/2006
JP  A-2008-277327  11/2008

*Primary Examiner* — Dana Ross
*Assistant Examiner* — John J Norton
(74) *Attorney, Agent, or Firm* — Oliff PLC

(57) ABSTRACT

A disclosed heat radiation arrangement includes a substrate that has a first surface on which a heating element is installed; a heat radiating member that abuts a surface of the heating element via a thermal conductive elastic member, the surface of the heating element being on an opposite side with respect to a side of the first surface; and a casing to which the substrate and the heat radiating member are attached, wherein the substrate is secured to the casing within a region between two extended sides and on opposite sides of the heating element when viewed in a direction perpendicular to the first surface, these two extended sides being defined by extending two opposite sides of the heating element, which form outer edges of the heating element, toward outer edges of the first surface.

6 Claims, 8 Drawing Sheets

(51) Int. Cl.
    *H01L 23/373*    (2006.01)
    *H01L 23/42*    (2006.01)

(56) References Cited

U.S. PATENT DOCUMENTS

| | | | |
|---|---|---|---|
| 7,656,666 B2* | 2/2010 | Jeong | 361/704 |
| 2002/0114137 A1* | 8/2002 | Pearson et al. | 361/709 |
| 2003/0227750 A1 | 12/2003 | Glovatsky et al. | |
| 2006/0104034 A1* | 5/2006 | Tsai et al. | 361/704 |
| 2006/0245167 A1* | 11/2006 | Jeong | 361/718 |
| 2006/0267192 A1 | 11/2006 | Chen | |
| 2008/0316720 A1 | 12/2008 | Maeno | |
| 2009/0122494 A1 | 5/2009 | Schmidt et al. | |
| 2009/0168361 A1* | 7/2009 | Chao et al. | 361/711 |
| 2010/0097768 A1* | 4/2010 | Ishii et al. | 361/719 |
| 2010/0263851 A1* | 10/2010 | Yasui | 165/185 |

* cited by examiner

HEAT RADIATION ARRANGEMENT

TECHNICAL FIELD

The present invention is related to a heat radiation arrangement for transmitting heat generated by a heating element to a heat radiating member.

BACKGROUND ART

According to a prior art, such a heat radiation arrangement is proposed in which a substrate on which a heating element such as a heating electric part or the like is installed is attached to a heat radiating member (heat sink) or a casing (chassis). An example is such that a heat radiation arrangement, etc., in which a substrate on which a heating element such as a heating electronic part or the like is installed is enclosed in an enclosure and a surface of the heating element, which is located on an opposite side with respect to the substrate, is brought into intimate contact with an inner wall of the enclosure directly or via a heat radiating member (see Patent Document 1).

In such a heat radiation arrangement, how to attach the substrate having the heating element installed thereon to the heat radiating member or the casing is a very important factor in terms of heat radiation efficiency.

[Patent Document 1] Japanese Laid-open Patent Publication No. 2002-050889

DISCLOSURE OF INVENTION

Problem to be Solved by Invention

However, according to the heat radiation arrangement (electronic part incorporating type enclosure) disclosed in Patent Document 1, for example, how to attach the substrate having the heating element installed thereon to the heat radiating member or the enclosure is not explicitly disclosed. Thus, there is a problem that a portion of the substrate near a portion on which the heating element is installed deforms (warpage occurs), depending on a status of the attachment between the substrate having the heating element installed thereon and the heat radiating member or the casing, and thus a degree of adhesion between the heating element and the heat radiating member is decreased, which decreases the heat radiation efficiency.

For example, according to a configuration in which the heating element installed on the substrate abuts the heat radiating member via a thermal conductive elastic member, and the substrate, the heat radiating member and the casing are coupled at only four corners thereof, distances from the heating element to the respective corners become longer. Thus, due to a resilience of the thermal conductive elastic member, the portion of the substrate near the heating element installed portion easily deforms (warpage easily occurs), and thus a degree of adhesion between the heating element and the heat radiating member is decreased, which decreases the heat radiation efficiency.

The present invention is made in consideration of the matters described above, and it is an object in one aspect of the invention to provide a heat radiation arrangement that is capable of suppressing a reduction in heat radiation efficiency.

Means to Solve the Problem

An embodiment of a heat radiation arrangement includes a substrate that has a first surface on which a heating element is installed; a heat radiating member that abuts a surface of the heating element via a thermal conductive elastic member, the surface of the heating element being opposite to a side of the first surface; and a casing to which the substrate and the heat radiating member are attached, wherein the substrate is secured to the casing within a region between two extended sides and on opposite sides of the heating element when viewed in a direction perpendicular to the first surface, these two extended sides being defined by extending two opposite sides of the heating element, which form outer edges of the heating element, toward outer edges of the first surface.

Another embodiment of a heat radiation arrangement includes a substrate having a first surface on which a heating element is installed; and a heat radiating member that abuts a surface of the heating element via a thermal conductive elastic member, the surface of the heating element being opposite to a side of the substrate; wherein the substrate is secured to the heat radiating member within a region between two extended sides and on opposite sides of the heating element when viewed in a direction perpendicular to the first surface, these two extended sides being defined by extending two opposite sides of the heating element, which form outer edges of the heating element, toward outer edges of the first surface.

Advantage of the Invention

According to one aspect of the invention, a heat radiation arrangement that is capable of suppressing a reduction in heat radiation efficiency can be provided.

Figure 1:
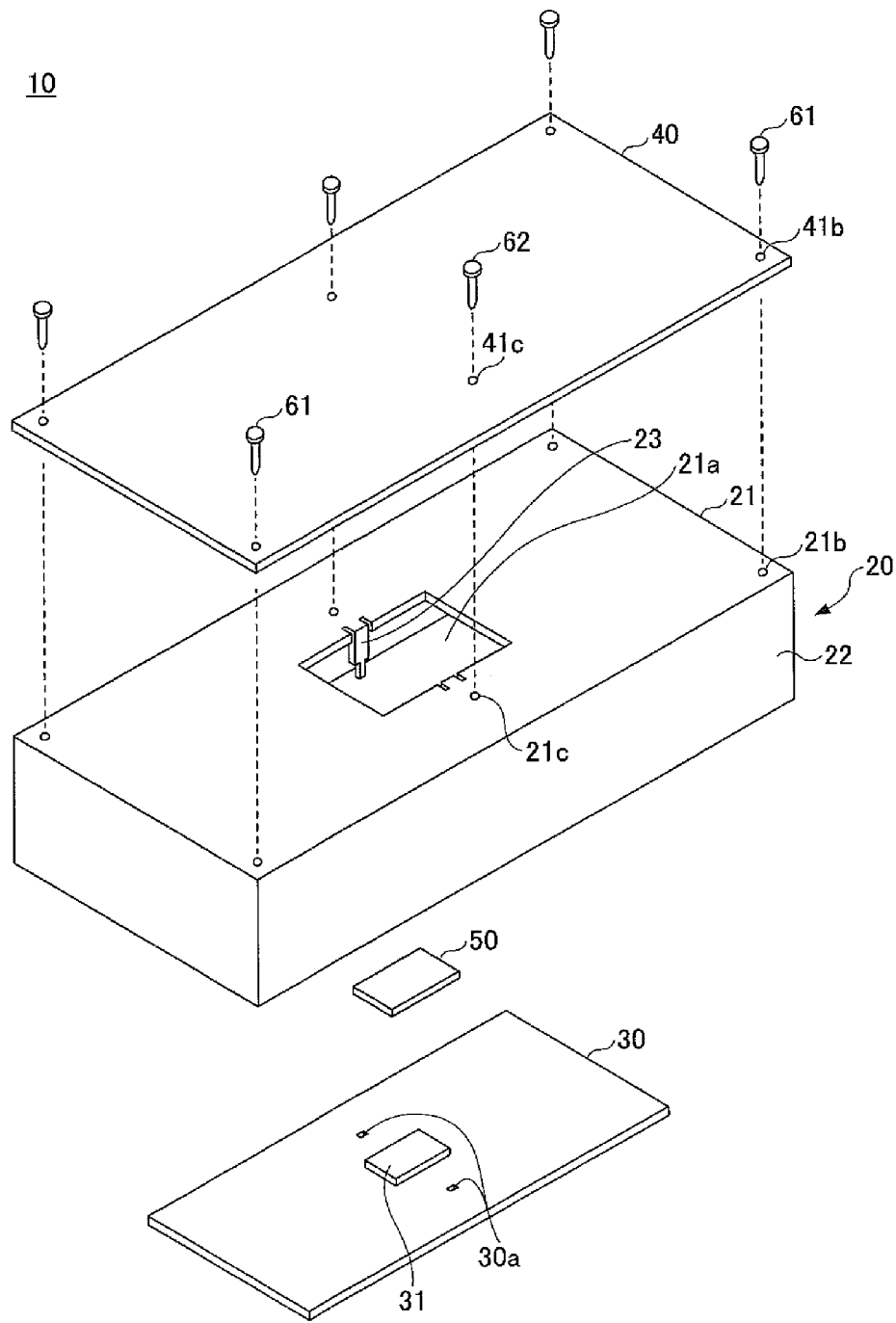
FIG. 1 is an exploded perspective view for exemplarily illustrating a heat radiation arrangement according to a first embodiment.

DESCRIPTION OF REFERENCE SYMBOLS 10, 10A, 10B heat radiation arrangement
20 casing
21 top plate
21a, 21h, 21k opening portion
21b, 21c, 21x, 21y, 21z tapped hole
22 side plate
23, 23a, 23b, 23c bending portion
24 spacer
24a column-like portion
24b column-like projecting portion
24c hole
25 nut
30 substrate
30a, 30x, 30y, 30z, 41b, 41c, 41x, 41y, 41z through hole
31, 31a, 31b, 31c heating element
40 heat radiating member
50, 50a, 50b, 50c thermal conductive elastic member
61, 62, 62a, 62b, 62c screw
90, 90a, 90b, 90c, 91, 91a securing region

BEST MODE FOR CARRYING OUT THE INVENTION

In the following, embodiments will be described by referring to the accompanying drawings. It is noted that in the respective drawings, the same elements are indicated by the same reference numerals, and explanation may be omitted to avoid overlaps.

First Embodiment

Figure 2:
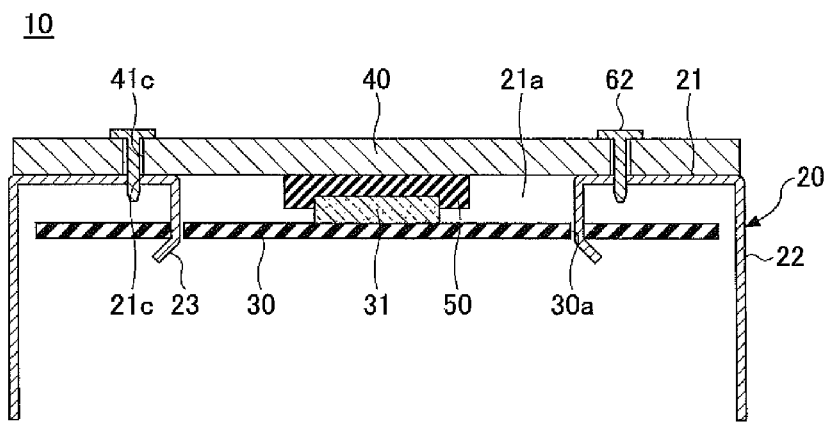
FIG. 2 is a cross-sectional view for exemplarily illustrating the heat radiation arrangement according to the first embodiment.

FIG. 1 is an exploded perspective view for exemplarily illustrating a heat radiation arrangement according to a first embodiment. FIG. 2 is a cross-sectional view for exemplarily illustrating the heat radiation arrangement according to the first embodiment. It is noted that in FIG. 2 the cross section in a direction perpendicular to a longitudinal direction of a casing 20 illustrated in FIG. 1 is illustrated. With reference to FIG. 1 and FIG. 2, a heat radiation arrangement 10 generally includes a casing 20, a substrate 30, a heat radiating member 40 and a thermal conductive elastic member 50. In the heat radiation arrangement 10, the substrate on which a heating element 31 is installed is secured within the casing 20, and the heat radiating member 40 is secured on the casing 20. The heating element 31 abuts the heat radiating member 40 via the thermal conductive elastic member 50. In the following, the respective components of the heat radiation arrangement 10 are described in detail.

The casing 20 is a box-shaped member for securing the substrate 30, the heat radiating member 40, etc., thereto. The casing includes a top plate 21 and a side plate that is perpendicularly bent in a downward direction from the top plate 21. The casing 20 is formed by a metal plate including aluminum (Al), etc., for example. The casing 20 may be formed by a steel plate. The thickness of the casing 20 may be within a range from 0.5 mm to 1 mm, for example. It is noted that in the example illustrated in FIG. 1 and FIG. 2, a bottom plate is not provided; however, a bottom plate may be provided at a lower end portion of the side plate 22, etc. Further, another substrate, etc., may be provided on an opposite side of the substrate 30 with respect to the top plate 21.

In the top plate 21 of the casing 20 is provided an opening portion 21a that has a substantially rectangular shape in a plane view. The opening portion 21a is provided such that the heating element 31 and the thermal conductive elastic member 50 are exposed to the side of the heat radiating member 40 from the side of the substrate 30. It is noted that a shape of the opening portion 21a in a plane view is not limited to a rectangular shape and may be arbitrary as long as the opening portion 21a can serve such a function.

A pair of bending portions 23 that are perpendicularly bent in a downward direction from the top plate 21 are provided at opposed portions of the opening portion 21a (two opposed sides of the opening portion 21a in a plane view). The pair of the bending portions 23 is provided for securing the substrate 30 in the casing 20. It is noted that in the example illustrated in FIG. 1 and FIG. 2 the bending portions 23 are provided such that a direction of a line (imaginary line, the same shall apply hereinafter) connecting the bending portions 23 substantially corresponds to a direction (shorter side direction) perpendicular to a longitudinal direction of the casing 20; however, this is not indispensable as described hereinafter.

The bending portions 23 each have a lower end portion formed to be narrower than an upper end portion (on the side of the top plate 21). The lower end portions are inserted into through holes 30a of the substrate 30 and bent at the back side of the substrate 30 (opposite side with respect to the top plate 21) to secure the substrate 30 within the casing 20 (a so-called "clinch construction"). Specifically, the substrate 30 is secured within the casing 20 such that the substrate 30 is suspended by the top plate 21 with the clinch construction.

At four corners of the top plate 21 of the casing 20 are provided tapped holes 21b (at four locations) for securing the heat radiating member 40 on the top plate 21 of the casing 20. Further, on opposite sides of the opening portion 21a near the bending portions 23 of the top plate 21 is provided a pair of tapped holes 21c (at two locations) for securing the heat radiating member 40 on the top plate 21 of the casing 20. It is noted that in the example illustrated in FIG. 1 and FIG. 2 the pair of the tapped holes 21c is provided such that a direction of a line connecting the tapped holes 21c substantially corresponds to a direction (shorter side direction) perpendicular to the longitudinal direction of the casing 20; however, this is not indispensable.

The substrate 30 is a wiring board that has a first surface (on the side of the heat radiating member 40) on which the heating element 31 is installed. Arbitrary electronic parts other than the heating element 31, such as a resistor, a capacitor, an inductor, etc., may be provided on the first surface of the substrate 30. Further, via holes may be formed in the substrate 30 and electronic parts may be installed on a second surface (on an opposite side with respect to the heat radiating member 40) of the substrate 30. The substrate 30 may be a FR-4 substrate (copper cladded multilayered plates formed by impregnating a flame-retardant woven fiberglass cloth with an epoxy resin), etc., for example. Further, the substrate 30 may be one of various wiring boards that include a multilayered wiring board manufactured by a built-up method, an IVH multilayered wiring board in which particular wiring layers are connected by IVH (Interstitial Via Hole), etc.

The heating element 31 is an electronic part including a semiconductor element whose heat value at the time of the operation is relatively high, for example. Specifically, the heating element 31 is an electronic part, etc., that includes a CPU (Central Processing Unit) and a switching element such as an IGBT (Insulated Gate Bipolar Transistor) and a MOSFET (Metal Oxide Semiconductor Field-Effect Transistor), for example.

A pair of through holes 30a that penetrate the substrate 30 are provided on opposite sides of a heating element installed portion (a portion on which the heating element 31 is installed) of the substrate 30. In the embodiment, the through holes 30a are provided in a direction (shorter side direction) perpendicular to the longitudinal direction of the casing 20. As described above, the lower end portions of the bending portions 23 are inserted into the corresponding through holes 30a, and are bent at the back side of the substrate 30 (opposite side with respect to the top plate 21) to secure the substrate 30 in the casing 20. A distance between these two through holes 30a may be about 40 mm, for example.

The heat radiating member 40 absorbs heat from the heating element 31 that is generated at the time of driving the heating element 31, and radiates the heat to the outside. It is preferable that a material of the heat radiating member 40 has a good thermal diffusion characteristic, a high rigidity and a good flatness. The flatness may be a metal plate such as an aluminum (Al) and a copper (Cu), for example. The thickness of the heat radiating member 40 may be about 5 mm, for example. A shape of the heat radiating member 40 in a plane view may be the same as that of the top plate 21 of the casing 20. At four corners of the heat radiating member 40 are provided through holes 41b (at four locations) that are connected to the corresponding tapped holes 21b of the top plate 21. Further, a pair of through holes 41c that are connected to the pair of the tapped holes 21c of the top plate 21 are provided in the heat radiating member 40.

The heat radiating member 40 is secured to the top plate 21 of the casing 20 with screws 61 inserted into the through holes 41b (at four locations) and screws 62 inserted into the through holes 41c (at two locations). For example, the screws 61 and 62 have external threads (not illustrated) formed thereon, and the external threads are engaged with internal threads (not illustrated) formed on inner wall surfaces of the tapped holes 21b and 21c, respectively, thereby causing the heat radiating member 40 to be brought into intimate contact with and secured to the top plate 21 of the casing 20.

By securing the high rigid heat radiating member 40 to the top plate 21 of the casing 20 at the (two) locations of the tapped holes 21c that are closer to the bending portions 23 than the tapped holes 21b (four locations), warpage of the casing 20 can be rectified, which enables maintaining the distance between the substrate 30 and the heat radiating member 40 that are attached to the casing 20. It is preferable that the locations of the tapped holes 21c (two locations) and the through holes 41c (two locations) are closer to the bending portions 23, because the effect of rectifying the warpage of the casing 20 becomes greater.

It is noted that if a surface of the heat radiating member 40 opposite to the surface that abuts the thermal conductive elastic member 50 is formed in a corrugated manner, etc., rather than in a planar manner, the heat radiation effect can be increased.

The thermal conductive elastic member 50 is provided between a first surface (opposite to the side of the substrate 30) of the heating element 31 installed on the substrate 30 and a first surface (on the side of the top plate 21) of the heat radiating member 40. The thermal conductive elastic member 50 ensures electrical insulation between the heating element 31 and the heat radiating member 40 while enabling high thermal conduction from the heating element 31 to the heat radiating member 40. The heat generated by the heating element 31 is transmitted to the heat radiating member 40 via the thermal conductive elastic member 50 where the heat is radiated. The outline of the thermal conductive elastic member 50 in a plane view may be greater than that of the heating element 31. A material of the conductive elastic member 50 may be silicon, etc., for example. Inorganic powders may be added to the silicon, etc.

The distance between the first surface of the heating element 31 (on an opposite side with respect to the substrate 30) and the first surface (on the side of the top plate 21) of the heat radiating member 40 may be a few millimeters, for example. It is preferable that the thickness of the thermal conductive elastic member 50 is greater than the distance between the first surface of the heating element 31 (on an opposite side with respect to the substrate 30) and the first surface (on the side of the top plate 21) of the heat radiating member 40 by about 10 to 20 percent of that distance. For example, when the distance between the first surface of the heating element 31 (on an opposite side with respect to the substrate 30) and the first surface (on the side of the top plate 21) of the heat radiating member 40 is 5 mm, it is preferable that the thickness of the thermal conductive elastic member 50 is within a range from 5.5 mm to 6 mm so that the thermal conductive elastic member 50 is attached in a deformed status with a deformation amount within a range of 0.5 mm to 1 mm. This is for the purpose of bringing the thermal conductive elastic member 50 into intimate contact with the heating element 31 and the heat radiating member 40.

Here, locations at which the substrate 30 is secured to the casing 20 (locations of the bending portions 23 and the through holes 30a) are described. According to research of the inventors, it can be found that the deformation (warpage) of the substrate 30 due to a reaction force of the thermal conductive elastic member 50 can be suppressed, when the substrate 30 is secured to the casing 20 within a region (referred to as a "securing region") between two extended sides and on opposite sides of the heating element 31 when viewed in a direction perpendicular to the first surface of the substrate 30 (on the side of the heat radiating member 40), wherein these two extended sides are defined by extending two opposite sides (shorter sides or longer sides) of the heating element 31, which form outer edges of the heating element 31, toward outer edges of the first surface of the substrate 30. In the following, with reference to FIG. 3 through FIG. 6, preferable examples of the locations at which the substrate is secured to the casing are described.

Figure 3:
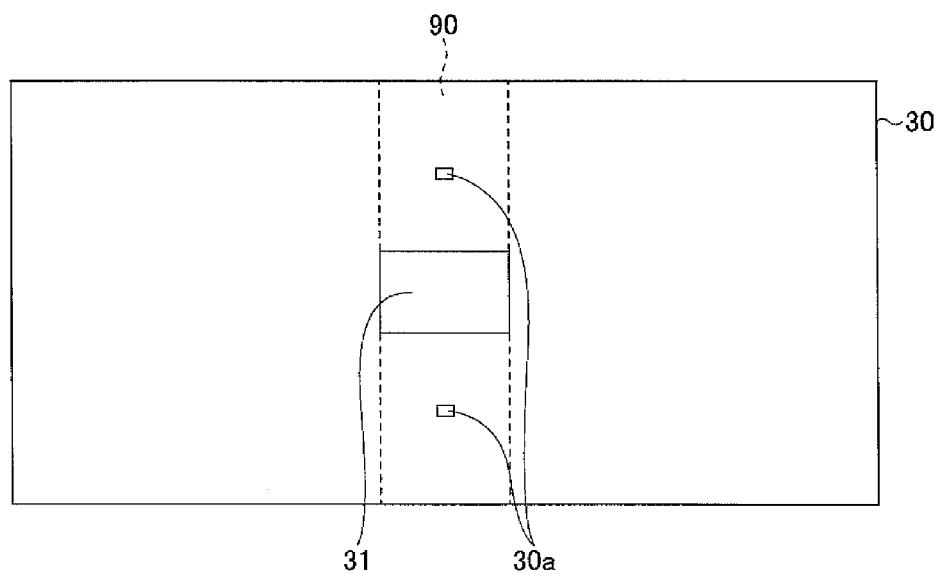
FIG. 3 is a diagram for illustrating an example of locations suited for securing a substrate to a casing in the first embodiment.

FIG. 3 is a diagram for illustrating an example of locations suited for securing the substrate to the casing in the first embodiment. In the example illustrated in FIG. 3, a securing region 90 is between two extended sides that are defined by extending two opposite shorter sides of the heating element 31, which form outer edges of the heating element 31, toward outer edges of the first surface of the substrate 30 (on the side of the heat radiating member 40), when viewed in a direction perpendicular to the first surface of the substrate 30. As illustrated in FIG. 3, by securing the substrate 30 to the casing 20 within the securing region 90 and on the opposite sides of the heating element 31, it becomes possible to suppress the deformation (warpage) of the substrate 30 due to a reaction force of the thermal conductive elastic member 50. It is noted that although the securing region 90 is not illustrated in FIG. 1 and FIG. 2, according to the embodiment, the locations (locations of the bending portions 23 and the through holes 30a) at which the substrate 30 is secured to the casing 20 are within the securing region 90, as illustrated in FIG. 3.

Figure 4:
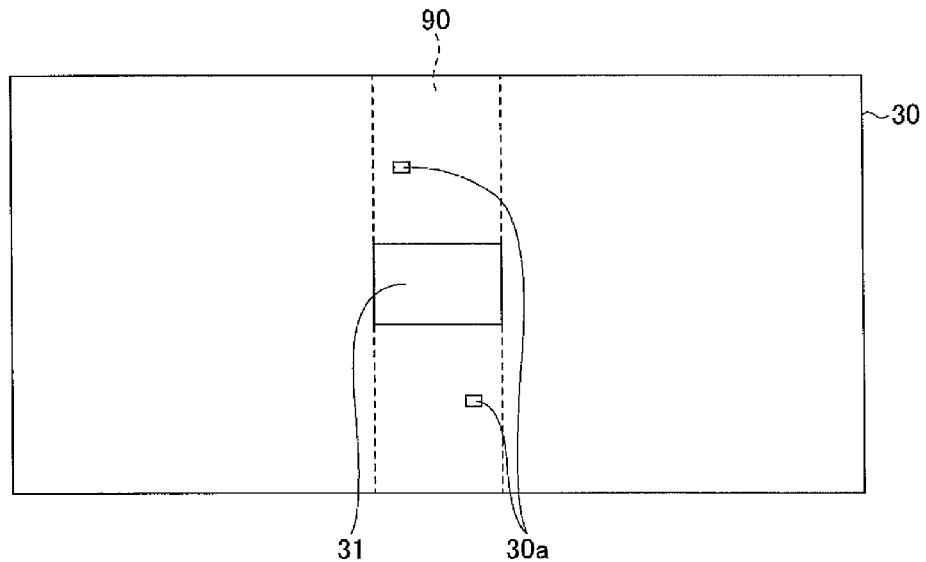
FIG. 4 is a diagram (No. 1) for illustrating another example of locations suited for securing the substrate to the casing in the first embodiment.
Figure 5:
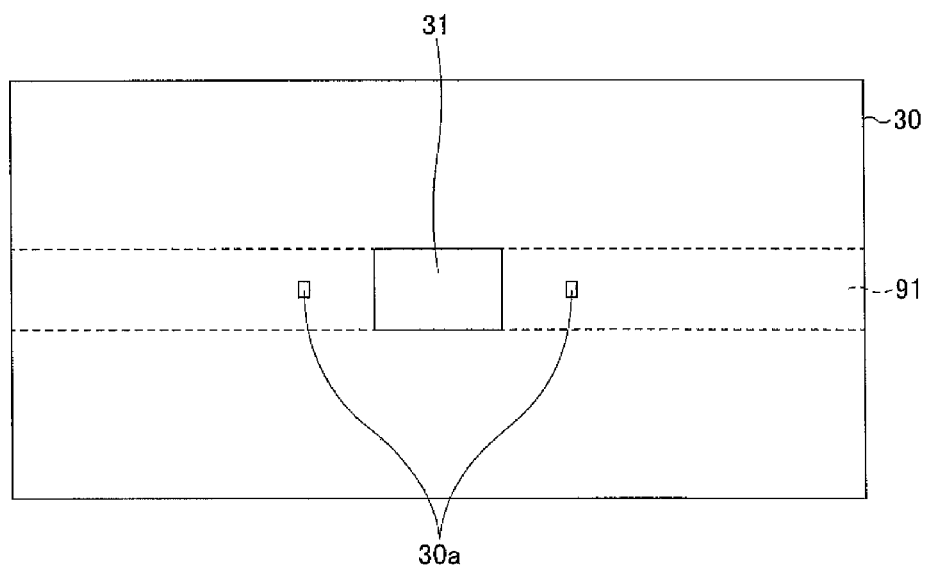
FIG. 5 is a diagram (No. 2) for illustrating another example of locations suited for securing the substrate to the casing in the first embodiment.
Figure 6:
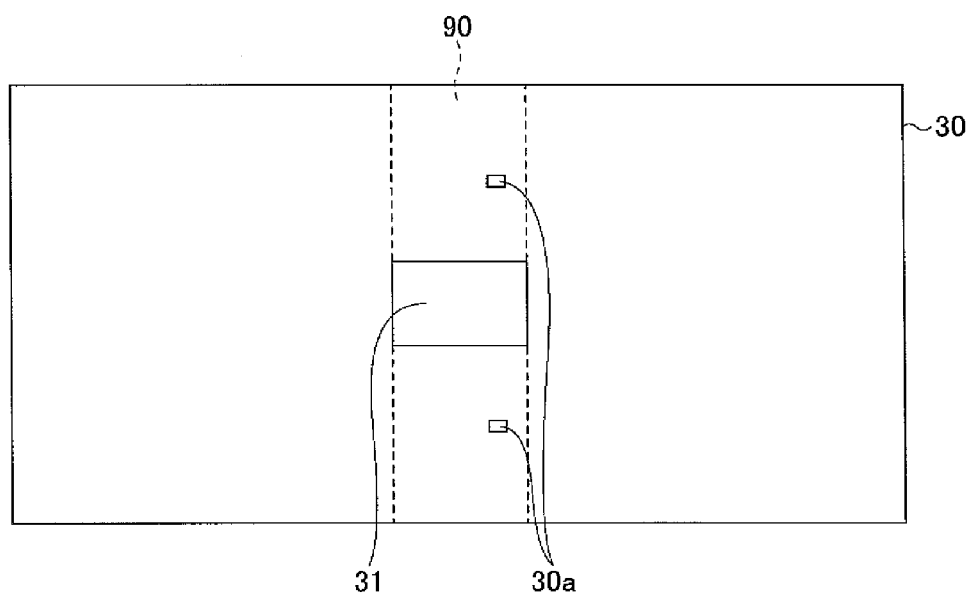
FIG. 6 is a diagram (No. 3) for illustrating another example of locations suited for securing the substrate to the casing in the first embodiment.

FIGS. 4 through 6 are diagrams for illustrating other examples of locations suited for securing the substrate to the casing in the first embodiment. In the example illustrated in FIG. 3, the line connecting the through holes 30a is substantially parallel to the shorter sides of the heating element 31; however, as illustrated in FIG. 4, the line connecting the through holes 30a may be inclined to intersect with the longer sides of the heating element 31.

In the example illustrated in FIG. 5, a securing region 91 is between two extended sides that are defined by extending two opposite longer sides of the heating element 31, which form outer edges of the heating element 31, toward outer edges of the first surface of the substrate 30 (on the side of the heat radiating member 40), when viewed in a direction perpendicular to the first surface of the substrate 30. As illustrated in FIG. 5, by securing the substrate 30 to the casing 20 within the securing region 91 and on the opposite sides of the heating element 31, it becomes possible to suppress the deformation (warpage) of the substrate 30 due to a reaction force of the thermal conductive elastic member 50. In this way, the securing region may be defined by extending the shorter sides or the longer sides of the heating element 31, which form outer edges of the heating element 31, toward outer edges of the first surface of the substrate 30.

Further, as illustrated in FIGS. 3 through 5, it is preferable that the line connecting the through holes 30a passes through a substantially center of the heating element 31 (i.e., the through holes 30a are substantially symmetrical about the central part of the heating element 31); however, as illustrated in FIG. 6, the effect can be obtained to a degree even if the line connecting the through holes 30a does not pass through the substantially central part of the heating element 31. It is noted that the example illustrated in FIG. 5 may be changed according to the example illustrated in FIG. 4 or FIG. 6.

Further, if the heating element 31 is an IC that has lead terminals only at two opposed sides, it is preferable that the locations (locations of the bending portions 23 and the through holes 30a) at which the substrate 30 is secured to the casing 20 are provided on a side without the lead terminals and within the securing region 90 or 91. This is because the substrate 30 can be secured at the locations closer to the heating element 61 because of an absence of the lead terminals, thereby enhancing the effect that the deformation (warpage) of the substrate 30 due to a reaction force of the thermal conductive elastic member 50 can be suppressed.

In other words, if the heating element 31 is an IC that has lead terminals only at its shorter sides, it is preferable that the locations (locations of the bending portions 23 and the through holes 30a) at which the substrate 30 is secured to the casing 20 are provided within the securing region 90 and on the opposite sides of the heating element 31. Further, if the heating element 31 is an IC that has lead terminals only at its longer sides, it is preferable that the locations (locations of the bending portions 23 and the through holes 30a) at which the substrate 30 is secured to the casing 20 are provided within the securing region 91 and on the opposite sides of the heating element 31. Further, if the heating element 31 is an IC that has lead terminals at its shorter and longer sides, the locations (locations of the bending portions 23 and the through holes 30a) at which the substrate 30 is secured to the casing 20 may be provided within the securing region 90 or 91. It is needless to say that if the through holes 30a are provided at the locations illustrated in FIGS. 4 through 6, the bending portions 23 are provided at the corresponding locations.

In this way, according to the first embodiment, in the heat radiation arrangement 10 that includes the substrate 30 that has a first surface on which the heating element 31 is installed; the heat radiating member 40 that abuts the first surface of the heating element 31 via the thermal conductive elastic member 50 on an opposite side with respect to a side of the substrate 30; and the casing 20 to which the substrate 30 and the heat radiating member 40 are attached, wherein the substrate 30 is secured to the casing 20 within the region (the securing region 90 or 91) between two extended sides and on opposite sides of the heating element 31 when viewed in a direction perpendicular to the first surface (on the side of the heat radiating member 40), these two extended sides being defined by extending two opposite sides of the heating element 31, which form outer edges of the heating element 31, toward outer edges of the first surface of the substrate 30. With this arrangement, because the deformation (warpage) of the substrate 30 due to a reaction force of the thermal conductive elastic member 50 is suppressed, it becomes possible to keep a high adhesiveness between the heating element 31 and the thermal conductive elastic member 50 and between the thermal conductive elastic member 50 and the heat radiating member 40, which enables suppressing the reduction in the heat radiation efficiency.

Further, because the deformation (warpage) of the substrate 30 due to a reaction force of the thermal conductive elastic member 50 is suppressed, it becomes possible to reduce a stress applied to the heating element 31 (including another installed part if it is installed closer to the heating element 31) installed on the substrate 30, which enables preventing destruction of the heating element 31 (including another installed part if it is installed closer to the heating element 31). It is noted that the destruction of the heating element 31 includes destruction of a solder layer for bonding the heating element 31 to the substrate 30, etc., for example.

Further, the heat radiating member 40 is secured to the casing 20 at the outer edge portion (at the locations of the through holes 41b) as well as at the locations (at the locations of the through holes 41c) that are closer to the locations (locations of the bending portions 23 and the through holes 30a) at which the substrate 30 is secured to the casing 20 than the outer edge portion. With this arrangement, because the warpage of the casing 20 can be rectified, it becomes possible to keep a constant distance between the substrate 30 and the heat radiating member 40 that are attached to the casing 20.

Further, because the heat radiation arrangement 10 is configured such that the heat radiating member 40 is exposed at the uppermost portion of the heat radiation arrangement 10, the heat radiation effect can be increased.

Second Embodiment

In the second embodiment, examples in which a plurality of heating elements are installed are described. It is noted that in the second embodiment an explanation for the components which are the same as those in the previously described embodiment is omitted.

Figure 7:
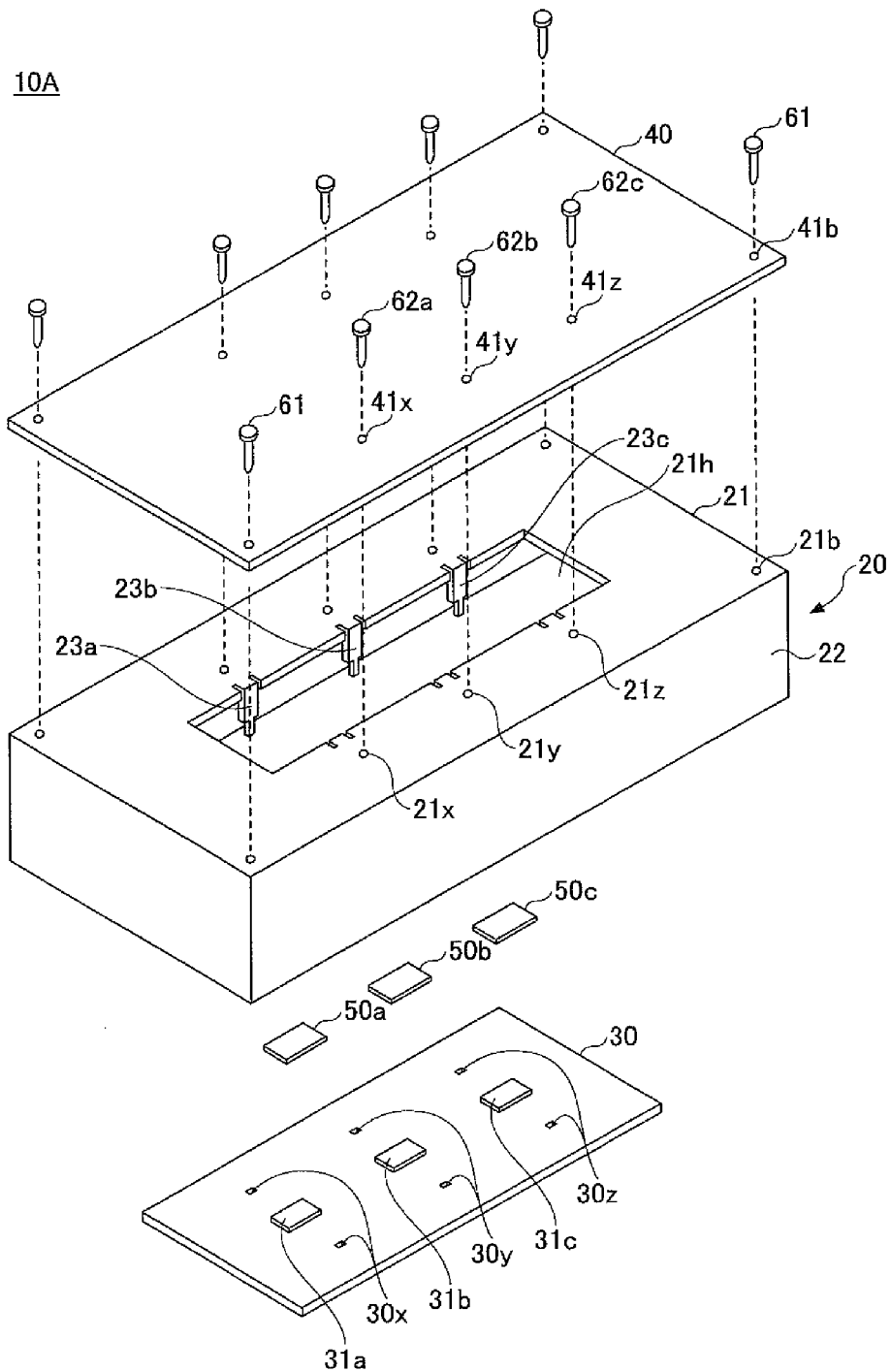
FIG. 7 is an exploded perspective view for exemplarily illustrating a heat radiation arrangement according to a second embodiment.

FIG. 7 is an exploded perspective view for exemplarily illustrating a heat radiation arrangement according to the second embodiment. It is noted that the cross section of a portion including respective pairs of bending portions is the same as that illustrated in FIG. 2, and thus a cross-sectional view is omitted to refer to FIG. 2. With reference to FIG. 2 and FIG. 7, in the heat radiation arrangement 10A, the substrate 30 on which heating elements 31a, 31b and 31c are installed is secured within the casing 20, and the heat radiating member 40 is secured on the casing 20. The heating elements 31a, 31b and 31c abut the heat radiating member 40 via thermal conductive elastic members 50a, 50b and 50c, respectively. In the following, the respective components of the heat radiation arrangement 10A are described in detail.

In the top plate 21 of the casing 20 is provided an opening portion 21h that has a substantially rectangular shape in a plane view. The opening portion 21h is provided such that the heating elements 31a, 31b and 31c and the thermal conductive elastic members 50a, 50b and 50c are exposed to the side of the heat radiating member 40 from the side of the substrate 30. It is noted that a shape of the opening portion 21h in a plane view is not limited to a rectangular shape and may be arbitrary as long as the opening portion 21h can serve such a function. Three opening portions may be provided such that the heating elements 31a, 31b and 31c and the thermal conductive elastic members 50a, 50b and 50c are exposed to the side of the heat radiating member 40 from the side of the substrate 30, respectively.

A pair of bending portions 23a, a pair of bending portions 23b and a pair of bending portions 23c that are perpendicularly bent in a downward direction from the top plate 21 are provided at opposed portions of the opening portion 21h (two opposed sides of the opening portion 21h in a plane view). The pair of bending portions 23a, the pair of bending portions 23b and the pair of bending portions 23c are provided for securing the substrate 30 in the casing 20. It is noted that, in the example illustrated in FIG. 7, with respect to the pair of the bending portions 23a, the bending portions 23a are provided such that a direction of a line connecting the bending portions 23 substantially corresponds to a direction (shorter side direction) perpendicular to a longitudinal direction of the casing 20; however, this is not indispensable. This holds true for the pair of the bending portions 23b and the pair of the bending portions 23c.

The bending portions 23a each have a lower end portion formed to be narrower than an upper end portion (on the side of the top plate 21). The lower end portions are inserted into through holes 30x of the substrate 30 and bent at the back side of the substrate 30 (opposite side with respect to the top plate 21) to secure the substrate 30 within the casing 20 (a so-called "clinch construction"). Similarly, the bending portions 23b each have a lower end portion formed to be narrower than an upper end portion (on the side of the top plate 21). The lower end portions are inserted into through holes 30y of the substrate 30 and bent at the back side of the substrate 30 (opposite side with respect to the top plate 21) to secure the substrate 30 within the casing 20 (a so-called "clinch construction"). Similarly, the bending portions 23c each have a lower end portion formed to be narrower than an upper end portion (on the side of the top plate 21). The lower end portions are inserted into through holes 30z of the substrate 30 and bent at the back side of the substrate 30 (opposite side with respect to the top plate 21) to secure the substrate 30 within the casing 20 (a so-called "clinch construction"). Specifically, the substrate 30 is secured within the casing 20 such that the substrate 30 is suspended by the top plate 21 with the clinch construction.

Further, on opposite sides of the opening portion 21h near the bending portions 23a of the top plate 21 is provided a pair of tapped holes 21x (at two locations) for securing the heat radiating member 40 on the top plate 21 of the casing 20. Similarly, on opposite sides of the opening portion 21h near the bending portions 23b of the top plate 21 is provided a pair of tapped holes 21y (at two locations) for securing the heat radiating member 40 on the top plate 21 of the casing 20. Similarly, on opposite sides of the opening portion 21h near the bending portions 23c of the top plate 21 is provided a pair of tapped holes 21z (at two locations) for securing the heat radiating member 40 on the top plate 21 of the casing 20. It is noted that in the example illustrated in FIG. 7 and FIG. 2 the pair of the tapped holes 21x are provided such that a direction of a line connecting the tapped holes 21x substantially corresponds to a direction (shorter side direction) perpendicular to the longitudinal direction of the casing 20; however, this is not indispensable. This holds true for the pair of the tapped holes 21y and the pair of the tapped holes 21z.

The heating elements 31a, 31b and 31c are electronic parts, etc., as is the case with the heating element 31. However, the heating elements 31a, 31b and 31c may have the same functions or different functions. Further, the heating elements 31a, 31b and 31c may have different sizes. It is noted that in the heat radiation arrangement 10A three heating elements (heating elements 31a, 31b and 31c) are installed on the substrate 30; however, the number of the heating elements installed on the substrate 30 is not limited to three, and it may be two or more than three.

A pair of through holes 30x that penetrates the substrate 30 is provided on opposite sides of a heating element installed portion (a portion on which the heating element 31a is installed) of the substrate 30. Similarly, a pair of through holes 30y that penetrates the substrate 30 is provided on opposite sides of a heating element installed portion (a portion on which the heating element 31b is installed) of the substrate 30. Similarly, a pair of through holes 30z that penetrates the substrate 30 is provided on opposite sides of a heating element installed portion (a portion on which the heating element 31c is installed) of the substrate 30. In the embodiment, the through holes 30x are provided in a direction (shorter side direction) perpendicular to the longitudinal direction of the casing 20. As described above, the lower end portions of the bending portions 23a are inserted into the corresponding through holes 30x, and are bent at the back side of the substrate 30 (opposite side with respect to the top plate 21) to secure the substrate 30 in the casing 20. A distance between these two through holes 30x may be about 40 mm, for example. This holds true for the through holes 30y and 30z.

The heat radiating member 40 has through holes 41x formed therein that are connected to the corresponding tapped holes 21x of the top plate 21, through holes 41y formed therein that are connected to the corresponding tapped holes 21y of the top plate 21, and through holes 41z formed therein that are connected to the corresponding tapped holes 21z of the top plate 21.

The heat radiating member 40 is secured to the top plate 21 of the casing 20 with screws 61 inserted into the through holes 41b (at four locations), screws 62a inserted into the through holes 41x (at two locations), screws 62b inserted into the through holes 41y (at two locations) and screws 62c inserted into the through holes 41z (at two locations). For example, the screws 61, 62a, 62b and 62c have external threads (not illustrated) formed thereon, and the external threads are engaged with internal threads (not illustrated) formed on inner wall surfaces of the tapped holes 21b, 21x, 21y and 21z, respectively, thereby causing the heat radiating member 40 to be brought into intimate contact with and secured to the top plate 21 of the casing 20.

By securing the high rigid heat radiating member 40 to the top plate 21 of the casing 20 at the locations of the tapped holes 21x through 21z (two locations for each) that are closer to the bending portions 23a through 23c than the tapped holes 21b (four locations), warpage of the casing 20 can be rectified, which enables keeping the distance between the substrate 30 and the heat radiating member 40 that are attached to the casing 20. It is preferable that the locations of the tapped holes 21x through 21z (two locations for each) and the through holes 41x through 41z (two locations for each) are closer to the bending portions 23a through 23c, respectively, because the effect of rectifying the warpage of the casing 20 becomes greater.

It is noted that if a surface of the heat radiating member 40 opposite to the surface that abuts the thermal conductive elastic member 50 is formed in a corrugated manner, etc., rather than in a plane manner, the heat radiation effect can be increased.

The thermal conductive elastic members 50a, 50b and 50c each are provided between a corresponding first surface (opposite to the side of the substrate 30) of the heating elements 31a, 31b and 31c installed on the substrate 30 and the first surface (on the side of the top plate 21) of the heat radiating member 40. The thermal conductive elastic members 50a, 50b and 50c ensures electrical insulation between the heating elements 31a, 31b and 31c and the heat radiating member 40, respectively, while enabling high thermal conduction from the heating elements 31a, 31b and 31c to the heat radiating member 40. The heat generated by the heating elements 31a, 31b and 31c is transmitted to the heat radiating member 40 via the thermal conductive elastic members 50a, 50b and 50c, respectively, where the heat is radiated. The outlines of the thermal conductive elastic members 50a, 50b and 50c in a plane view may be greater than those of the heating elements 31a, 31b and 31c, respectively. A material of the conductive elastic members 50a, 50b and 50c may be silicon, etc., for example. Inorganic powders may be added to the silicon, etc.

The distance between the corresponding first surfaces of the heating elements 31a, 31b and 31c (on an opposite side with respect to the substrate 30) and the first surface (on the side of the top plate 21) of the heat radiating member 40 may be a few millimeters, for example. It is preferable that the thickness of the thermal conductive elastic members 50a, 50b and 50c is greater than the distance between the corresponding first surfaces of the heating elements 31a, 31b and 31c (on an opposite side with respect to the substrate 30) and the first surface (on the side of the top plate 21) of the heat radiating member 40 by about 10 to 20 percent of that distance. For example, when the distance between the corresponding first surfaces of the heating elements 31a, 31b and 31c (on an opposite side with respect to the substrate 30) and the first surface (on the side of the top plate 21) of the heat radiating member 40 is 5 mm, it is preferable that the thickness of the thermal conductive elastic members 50a, 50b and 50c is within a range from 5.5 mm to 6 mm so that the thickness of the thermal conductive elastic members 50a, 50b and 50c are attached in a deformed status with a deformation amount within a range from 0.5 mm to 1 mm. This is for the purpose of bringing the thermal conductive elastic members 50a, 50b and 50c into intimate contact with the heating elements 31a, 31b and 31c, respectively, and the heat radiating member 40.

Figure 8:
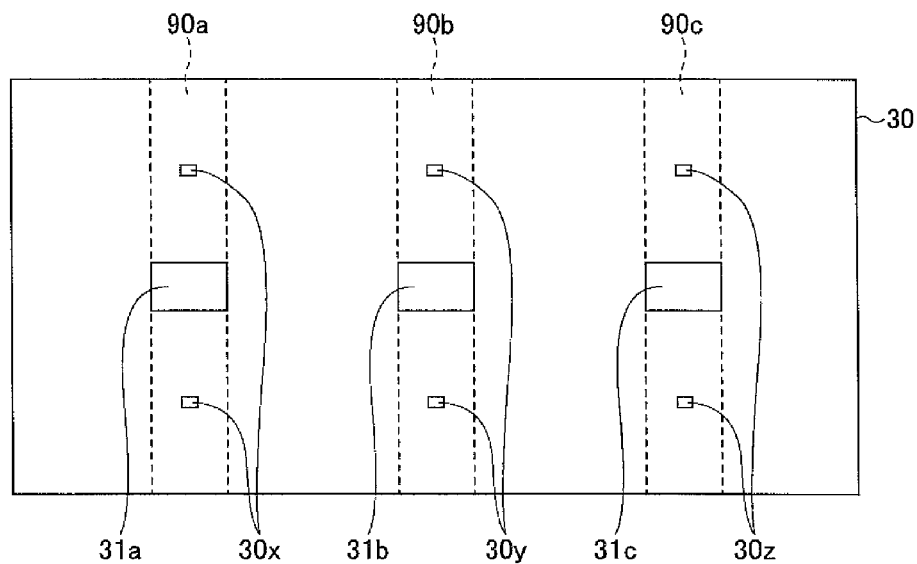
FIG. 8 is a diagram for illustrating an example of locations suited for securing a substrate to a casing in the second embodiment.

With reference to FIG. 8, preferred locations at which the substrate 30 is secured to the casing 20 are described. FIG. 8 is a diagram for illustrating an example of locations suited for securing the substrate to the casing in the second embodiment. In the example illustrated in FIG. 8, a securing region 90a is between two extended sides that are defined by extending two opposite shorter sides of the heating element 31a, which form outer edges of the heating element 31, toward outer edges of the first surface of the substrate 30 (on the side of the heat radiating member 40), when viewed in a direction perpendicular to the first surface of the substrate 30. Similarly, a securing region 90b is between two extended sides that are defined by extending two opposite shorter sides of the heating element 31, which form outer edges of the heating element 31b, toward outer edges of the first surface of the substrate 30 (on the side of the heat radiating member 40), when viewed in a direction perpendicular to the first surface of the substrate 30. Similarly, a securing region 90c is between two extended sides that are defined by extending two opposite shorter sides of the heating element 31, which form outer edges of the heating element 31c, toward outer edges of the first surface of the substrate 30 (on the side of the heat radiating member 40), when viewed in a direction perpendicular to the first surface of the substrate 30.

As illustrated in FIG. 8, by securing the substrate 30 to the casing 20 within the securing region 90a and on the opposite sides of the heating element 31a, securing the substrate 30 to the casing 20 within the securing region 90b and on the opposite sides of the heating element 31b, and securing the substrate 30 to the casing 20 within the securing region 90c and on the opposite sides of the heating element 31c, it becomes possible to suppress the deformation (warpage) of the substrate 30 due to the respective reaction forces of the thermal conductive elastic members 50a, 50b and 50c.

It is noted that although the securing regions 90a, 90b and 90c are not illustrated in FIG. 7, according to the embodiment, the locations (locations of the bending portions 23a through 23c and the through holes 30x through 30z) at which the substrate 30 is secured to the casing 20 are within the securing regions 90a, 90b and 90c, as illustrated in FIG. 8. It is noted that the locations (locations of the bending portions 23a through 23c and the through holes 30x through 30z) at which the substrate 30 is secured to the casing 20 is not limited to those illustrated in FIG. 8 as long as they are within the securing regions 90a, 90b and 90c. Thus, the locations may be changed as is the case with FIG. 4 or FIG. 6.

Figure 9:
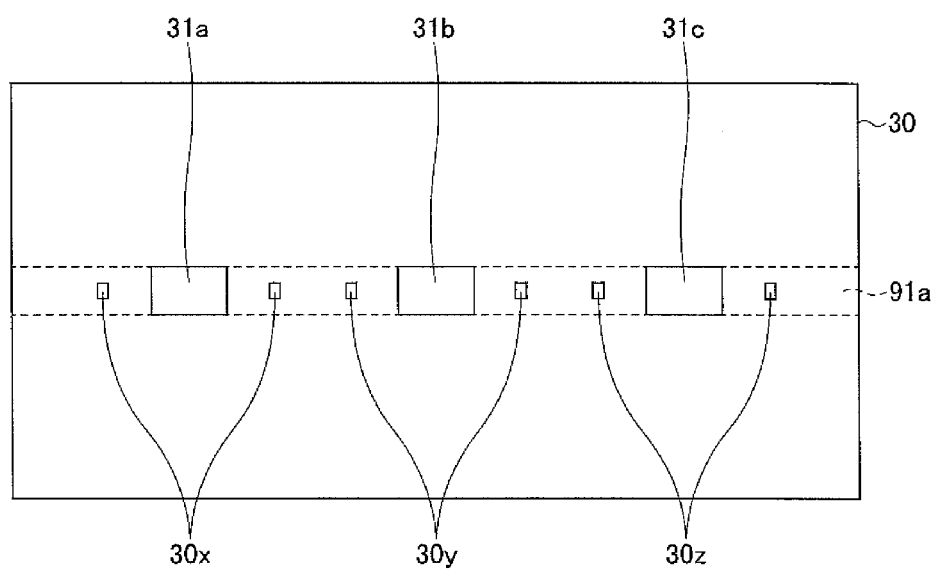
FIG. 9 is a diagram (No. 2) for illustrating another example of locations suited for securing the substrate to the casing in the second embodiment.

The substrate 30 may be secured within such a securing region 90a as illustrated in FIG. 9. In FIG. 9, the securing region 90a is between two extended sides that are defined by extending two opposite longer sides of the heating elements 31a, 31b and 31c, which form outer edges of the heating elements 31a, 31b and 31c, toward outer edges of the first surface of the substrate 30 (on the side of the heat radiating member 40), when viewed in a direction perpendicular to the first surface of the substrate 30. As illustrated in FIG. 9, by securing the substrate 30 to the casing 20 within the securing region 91a and on the opposite sides of the respective heating elements 31a, 31b and 31c, it becomes possible to suppress the deformation (warpage) of the substrate 30 due to reaction forces of the respective thermal conductive elastic members 50a, 50b and 50c.

It is noted that if the heating elements 31a, 31b and 31c are not installed in line in a predetermined arrangement direction, the substrate 30 may be secured to the casing within securing regions that are between two extended sides that are defined by extending two opposite longer sides of the respective heating elements 31a, 31b and 31c, which form outer edges of the respective heating elements 31a, 31b and 31c, toward outer edges of the first surface of the substrate 30. Further, if the heating elements 31a, 31b and 31c have different outlines, the substrate 30 may be secured to the casing within securing regions that are between two extended sides that are defined by extending two opposite longer sides of the respective heating elements 31a, 31b and 31c, which form outer edges of the respective heating elements 31a, 31b and 31c, toward outer edges of the first surface of the substrate 30.

In this way, the securing regions may be defined by extending the shorter sides or the longer sides of the heating elements 31a, 31b and 31c, which form outer edges of the heating elements 31a, 31b and 31c, toward outer edges of the first surface of the substrate 30. However, in the case of FIG. 9, it is necessary to provide three opening portions, instead of the opening portion 21h, for exposing the heating elements 31a, 31b and 31c, respectively, as well as one of the bending portions 23a and one of the bending portions 23c between the neighboring opening portions. This holds true for a configuration illustrated in FIG. 10 described hereinafter.

Figure 10:
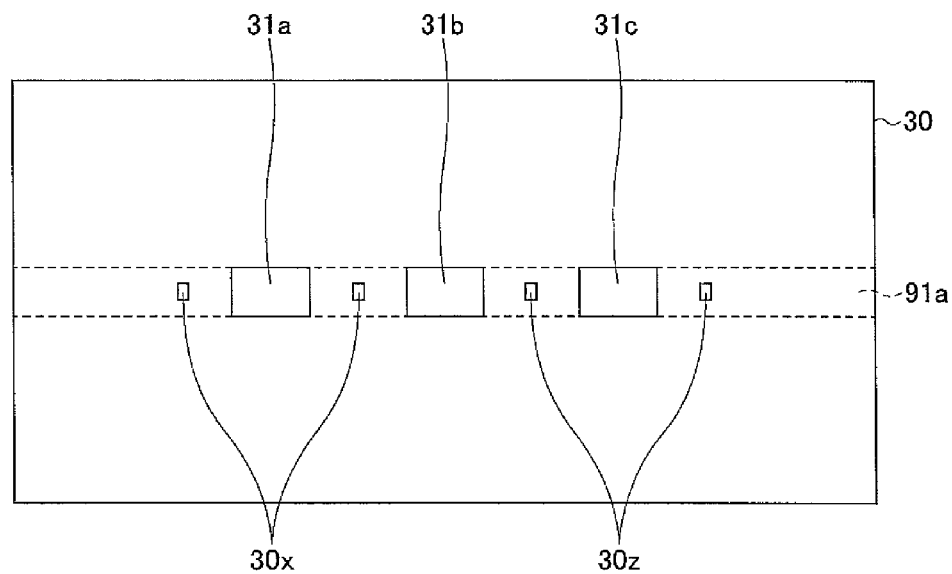
FIG. 10 is a diagram (No. 2) for illustrating another example of locations suited for securing the substrate to the casing in the second embodiment.

When the heating elements 31a, 31b and 31c are installed in line in a predetermined arrangement direction, the substrate 30 is secured to the casing 20 at a single location between the neighboring heating elements, as illustrated in FIG. 10, which enables reducing the number of the through holes and the bending portions. In other words, one of the through holes 30x is provided between the heating elements 31a and 31b, and one of the through holes 30z is provided between the heating elements 31b and 31c. With this arrangement, because one of the through holes 30x and one of the through holes 30z can function as the through holes 30y, the through holes 30y can be omitted, which can reduces the number of the through holes from 6 (see FIG. 9) to 4. Further, accordingly, the number of the bending portions can be reduced from 6 to 4.

In this way, according to the second embodiment, in the heat radiation arrangement 10A that includes the substrate 30 that has a first surface on which the heating elements 31a, 31b and 31c are installed; the heat radiating member 40 that abuts the surfaces of the heating elements 31a, 31b and 31c via the thermal conductive elastic members 50a, 50b and 50c on an opposite side with respect to a side of the substrate 30; and the casing 20 to which the substrate 30 and the heat radiating member 40 are attached, wherein the substrate 30 is secured to the casing 20 within the regions (the securing region 90a, 90b and 90c) between two corresponding extended sides and on opposite sides of the corresponding heating elements 31a, 31b and 31c when viewed in a direction perpendicular to the first surface (on the side of the heat radiating member 40), these two corresponding extended sides being defined by extending two opposite sides of the corresponding heating element 31a, 31b or 31c, which form outer edges of the corresponding heating element 31a, 31b or 31c, toward outer edges of the first surface of the substrate 30. With this arrangement, the same effects as those of the first embodiment can be obtained.

Third Embodiment

In the third embodiment, examples in which the substrate 30 is secured to the heat radiating member 40 not via the casing 20 are described. It is noted that in the third embodiment an explanation for the components which are the same as those in the previously described embodiments is omitted.

Figure 11:
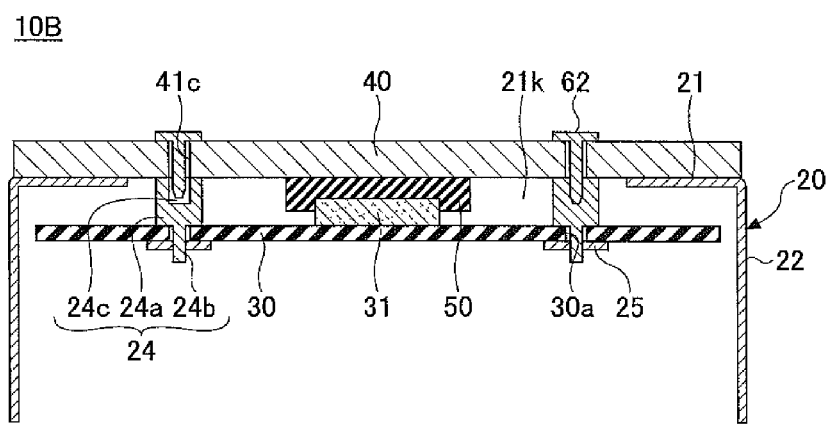
FIG. 11 is a cross-sectional view for exemplarily illustrating the heat radiation arrangement according to a third embodiment.

FIG. 11 is a cross-sectional view for exemplarily illustrating the heat radiation arrangement according to the third embodiment. With reference to FIG. 11, in a heat radiation arrangement 10B, an opening portion 21k that has a substantially rectangular shape in a plane view is formed in the top plate 21 of the casing 20. The opening portion 21k is provided such that the through holes 30a, the heating element 31 and the thermal conductive elastic member 50 are exposed to the side of the heat radiating member 40 from the side of the substrate 30. At the opening portion 21k, there is no bending portion. It is noted that a shape of the opening portion 21k in a plane view is not limited to a rectangular shape and may be arbitrary as long as the opening portion 21k can serve such a function. The heat radiating member 40 is secured to the top plate 21 of the casing at the four corners thereof, as is the case with the first embodiment, although it is not illustrated in FIG. 11.

The substrate 30 is secured to the heat radiating member 40 via spacers 24 (space holding members). It is noted that locations of the spacers 24 are within the securing region 90 described above with reference to the first embodiment. The spacer 24 has such a construction that a column-like projecting portion 24b is provided at one end of a column-like portion 24a and a hole 24c is provided at the other end. For example, the column-like portion 24a has a cylindrical shape whose diameter is greater than that of the through hole 30a and 41c, and the column-like projecting portion 24b has a cylindrical shape whose diameter is smaller than that of the through hole 30a. The column-like portion 24a and the column-like projecting portion 24b are formed such that they are concentric. The column-like projecting portion 24b has an external thread (not illustrated) formed on an outer wall surface thereof, and the hole 24c has an internal thread (not illustrated) formed on an inner wall surface thereof.

The column-like projecting portion 24b is inserted into the through hole 30a from the side of the first surface of the substrate 30 (on the side of the heat radiating member 40), which causes a tip portion to project from a second surface of the substrate 30 (on the opposite side with respect to the heat radiating member 40). One end of the column-like portion 24a except for the column-like projecting portion 24b abuts the first surface of the substrate 30. The tip portion of the column-like projecting portion 24b is engaged with a nut 25 on the side of the second surface of the substrate 30. Another end of the column-like portion 24a abuts the first surface (on the side of the top plate 21) of the heat radiating member 40, and the through hole 41c is connected to the hole 24c. A screw 62 is inserted into the through hole 41c such that a tip portion of the screw 62 reaches the hole 24c to engage with the hole 24c.

The height of the column-like portion 24a may be a few millimeters, for example. when the height of the column-like portion 24a from the first surface of the heating element 31 (opposite to the side of the substrate 30) is 5 mm, for example, and the thickness of the thermal conductive elastic member 50 is within a range from 5.5 mm to 6 mm which is greater than the height of the column-like portion 24a by about 10 to 20 percent of that height, the heating element 31 is brought into intimate contact with the heat radiating member 40 such that the thermal conductive elastic member 50 is deformed with a deformation amount within a range from 0.5 mm to 1 mm, and thus the distance between the first surface of the heating element 31 (on an opposite side with respect to the substrate 30) and the first surface (on the side of the top plate 21) of the heat radiating member 40 is kept at 5 mm.

Figure 12:
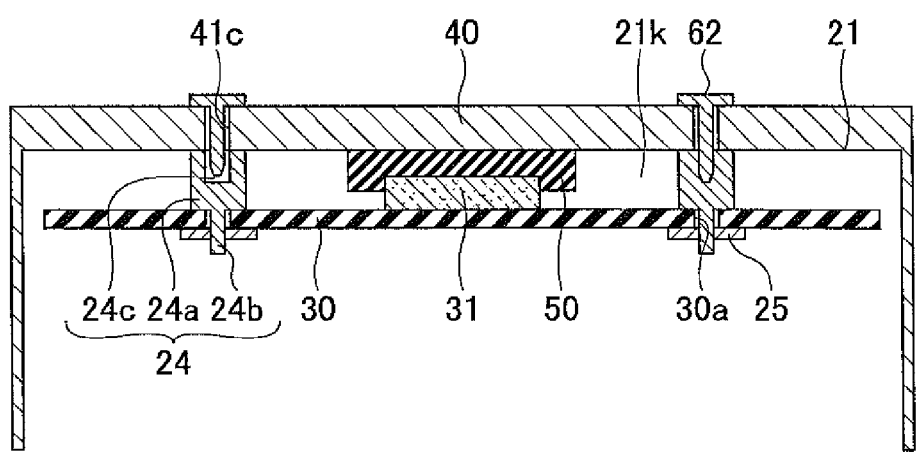
FIG. 12 is a cross-sectional view for exemplarily illustrating the heat radiation arrangement according to a variant of the third embodiment.

It is noted that the heat radiation arrangement 10B according to the third embodiment may be changed as a heat radiation arrangement 10C disclosed in FIG. 12. FIG. 12 is a cross-sectional view for exemplarily illustrating the heat radiation arrangement according to a variant of the third embodiment. With reference to FIG. 12, in a heat radiation arrangement 10C, a side plate is formed by bending the outer edge portion of the heat radiating member 40 perpendicularly in a downward direction. With this arrangement, it is possible to eliminate the casing, which can simplify the construction. In this way, the heat radiating member 40 may be integrated with the casing 20. In other words, the casing 20 may be omitted by providing the heat radiating member 40 with a function of the casing 20.

According to the third embodiment and its variant, the same effects as the first embodiment as well as further effects described hereinafter can be obtained. Because the substrate 30 is secured to the heat radiating member 40 without the casing 20 therebetween, a possibility that the distance between the substrate 30 and the heat radiating member 40 varies due to the warpage of the casing 20 can be completely eliminated. Further, the casing 20 can be omitted by providing the heat radiating member 40 with a function of the casing 20.

It is noted that if a plurality of the heating elements are installed on the substrate, the substrate 30 can be secured to the heat radiating member 40 without the casing 20 therebetween by providing the spacers at the location of the respective bending portions disclosed in the second embodiment.

The preferred embodiments and variants thereof are described above in detail. However, it should be understood that the present invention is not limited to the above-described embodiments, and other embodiments, variations thereof, additions and eliminations may be made within the scope contemplated by those skilled in the art.

For example, in the first embodiment, two bending portions 23 and two through holes 30a are provided for securing the substrate 30 to the casing 20; however, the number of the bending portions 23 and the through holes 30a may be increased.

The present application is based on Japanese Patent Application No. 2011-123475, filed on Jun. 1, 2011, the entire contents of which are hereby incorporated by reference.

The invention claimed is:

1. A heat radiation arrangement, comprising:
   a substrate having a first surface on which a heating element is installed;
   a heat radiating member that abuts a second surface of the substrate via a thermal conductive elastic member, the second surface being opposite to the first surface; and
   a casing to which the substrate and the heat radiating member are attached, wherein
   the substrate is secured to the casing within a region between two extended sides and on opposite sides of the heating element when viewed in a direction perpendicular to the first surface, these two extended sides being defined by extending two opposite sides of the heating element, which form outer edges of the heating element, toward outer edges of the first surface,
   the heat radiating member is secured to the casing at an outer edge portion thereof, and
   the heat radiating member is further secured to the casing at a location that is closer to locations at which the heating element is secured to the casing than the outer edge portion.

2. The heat radiation arrangement of claim 1, wherein a plurality of heating elements, one of which is said heating element, are installed on the substrate, and
   the substrate is secured to the casing within respective regions between two extended sides of the respective heating elements and on opposite sides of the respective heating elements when viewed in a direction perpendicular to the first surface, these two extended sides of the respective heating elements being defined by extending two opposite sides of the corresponding heating elements, which form outer edges of the corresponding heating elements, toward outer edges of the first surface.

3. The heat radiation arrangement of claim 2, wherein the heating elements are installed in line in a predetermined arrangement direction,
   the two extended sides are parallel to each other in the arrangement direction, and
   the substrate is secured to the casing at every single location between the neighboring heating elements.

4. A heat radiation arrangement, comprising:
   a substrate having a first surface on which a heating element is installed; and
   a heat radiating member that abuts a surface of the heating element via a thermal conductive elastic member, the surface of the heating element being on an opposite side with respect to the substrate; and
   a casing to which the heat radiating member is attached, wherein
   the substrate is secured to the heat radiating member within a region between two extended sides and on opposite sides of the heating element when viewed in a direction perpendicular to the first surface, these two extended sides being defined by extending two opposite sides of the heating element, which form outer edges of the heating element, toward outer edges of the first surface, and
   the heat radiating member is secured to the casing on an outer side with respect to locations at which the substrate is secured to the heat radiating member.

5. The heat radiation arrangement of claim 4, wherein a plurality of heating elements, one of which is said heating element, are installed on the substrate,
   the substrate is secured to the heat radiating member within respective regions between two extended sides of the respective heating elements and on opposite sides of the respective heating elements when viewed in a direction perpendicular to the first surface, these two extended sides of the respective heating elements being defined by extending two opposite sides of the corresponding heating elements, which form outer edges of the corresponding heating elements, toward outer edges of the first surface.

6. The heat radiation arrangement of claim 5, wherein the heating elements are installed in line in a predetermined arrangement direction,
   the two extended sides are parallel to each other in the arrangement direction, and
   the substrate is secured to the heat radiating member at every single location between the neighboring heating elements.

* * * * *